US009590612B2

(12) United States Patent
Mori (10) Patent No.: US 9,590,612 B2
(45) Date of Patent: Mar. 7, 2017

(54) DRIVE CIRCUIT OF VOLTAGE-CONTROLLED DEVICE

(71) Applicant: FUJI ELECTRIC CO., LTD., Kawasaki (JP)

(72) Inventor: Takahiro Mori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/186,976

(22) Filed: Jun. 20, 2016

(65) Prior Publication Data

US 2016/0301406 A1 Oct. 13, 2016

Related U.S. Application Data

(63) Continuation of application No. PCT/JP2015/002570, filed on May 21, 2015.

(30) Foreign Application Priority Data

Jul. 17, 2014 (JP) .................................. 2014-146941

(51) Int. Cl.
*H03K 3/00* (2006.01)
*H03K 17/14* (2006.01)
(Continued)

(52) U.S. Cl.
CPC ......... *H03K 17/145* (2013.01); *H01L 21/822* (2013.01); *H01L 27/04* (2013.01);
(Continued)

(58) Field of Classification Search
CPC .................................................. H03K 17/145
See application file for complete search history.

(56) References Cited

U.S. PATENT DOCUMENTS

| 6,222,403 B1 | 4/2001 | Mitsuda |
| 2004/0135528 A1 | 7/2004 | Yasohara et al. |

(Continued)

FOREIGN PATENT DOCUMENTS

| JP | 11-346147 | 12/1999 |
| JP | 2004-215493 | 7/2004 |

(Continued)

OTHER PUBLICATIONS

International Search Report mailed Aug. 4, 2015, in corresponding International Application No. PCT/JP2015/002570.

*Primary Examiner* — Daniel Puentes (57) ABSTRACT

A drive circuit includes: a constant current circuit configured to supply a constant current to a gate of the voltage-controlled device, and to turn on the voltage-controlled device; a discharge circuit configured to supply a discharge current between the gate and an emitter of the voltage-controlled device, and to turn off the voltage-controlled device; a switch circuit configured to operate one of the constant current circuit or the discharge circuit depending on a drive signal, and to turn on or turn off the voltage-controlled device; a current instruction value generation circuit configured to generate and output at least a current instruction value that sets an output current from the constant current circuit; and a current control circuit configured to control the output current from the constant current circuit based on the current instruction value generated by the current instruction value generation circuit.

8 Claims, 4 Drawing Sheets

(51) Int. Cl.
- *H01L 21/822* (2006.01)
- *H01L 27/04* (2006.01)
- *H03K 17/16* (2006.01)
- *H03K 17/567* (2006.01)
- *H02M 1/08* (2006.01)

(52) U.S. Cl.
CPC ......... *H03K 17/162* (2013.01); *H03K 17/567* (2013.01); *H02M 1/08* (2013.01)

(56) References Cited

U.S. PATENT DOCUMENTS

| | | |
|---|---|---|
| 2008/0094111 A1 | 4/2008 | Nakamori et al. |
| 2013/0147525 A1* | 6/2013 | Takagiwa ............... H03K 3/012 327/109 |
| 2013/0285732 A1 | 10/2013 | Mori |

FOREIGN PATENT DOCUMENTS

| | | |
|---|---|---|
| JP | 2008-103895 | 5/2008 |
| JP | 2009-135626 | 6/2009 |
| JP | 2013-219633 | 10/2013 |

* cited by examiner

DRIVE CIRCUIT OF VOLTAGE-CONTROLLED DEVICE

CROSS-REFERENCE TO RELATED APPLICATIONS

This application is a continuation application filed under 35 U.S.C. §111(a), of International Application PCT/JP2015/002570, filed May 21, 2015, and claims foreign priority benefit to Japanese Patent Application No. 2014-146941, filed Jul. 17, 2014, the contents of which are incorporated herein by reference.

TECHNICAL FIELD

The present invention relates to drive circuits of voltage-controlled devices, in particular, relates to a drive circuit of a voltage-controlled device capable of reducing an increase in similar type of the drive circuits.

BACKGROUND ART

In a semiconductor power converter, a voltage-controlled power device such as an Insulated Gate Bipolar Transistor (IGBT) or a power MOSFET is used, and an inverter is configured with a drive circuit for driving these power devices. Drawbacks caused when driving the power devices are losses, noises, and their temperature characteristics at the time of turning them on.

To reduce the losses, noises and temperature dependences at the time turning on the power devices, there are proposals of, for example, the drive circuit of an insulated gate type device disclosed in Patent Literature 1 and the drive circuit of a power transistor disclosed in Patent Literature 2.

In a conventional example disclosed in the Patent Literature 1, the gate of the insulated gate type device is connected to the power supply potential side through the constant current source at the time of turning on the voltage-controlled device, and the gate of the insulated gate type device is connected to the emitter side at the time of turning it off.

In a conventional example disclosed in Patent Literature 2, other than the configuration disclosed in Patent Literature 1, a zener diode for detecting the temperature of the power transistor to which the constant current has been supplied from the constant current source is provided, so that a voltage output corresponding to the temperature of the power transistor output from the anode of the zener diode for detecting the temperature is fed back to a current controller of controlling the constant current of the constant current source.

CITATION LIST

Patent Literature

PTL 1: JP 2008-103895 A
PTL 2: JP 2013-219633 A

SUMMARY OF INVENTION

Technical Problem

In an ordinary Intelligent Power Module (IPM), the voltage-controlled semiconductor power device such as an IGBT and its drive circuit are mounted on an identical module, but combinations of the voltage-controlled semiconductor device and the drive circuit are also increased in accordance with diversification in recent system use. As a result, the manufacturing methods of many kinds in small quantities, which increases the number of module types, tend to be main streams.

The voltage-controlled power device and its drive circuit, however, are made of semiconductor devices, and photo masks to be used for the manufacturing process are increased, as the number of the types increases. On the other hand, in the method of manufacturing many kinds in small quantities, since the increased speed of the photo masks is faster than the speed in the usual high-volume manufacturing method, there is a disadvantage that storage and management of high-volume production members are complicated.

Therefore, the present invention has been made in view of the above-described circumstances, and has an object to provide a drive circuit of a voltage-controlled device capable of adjusting turn-on capabilities by conforming the drive circuit to the specifications of at least one of the voltage-controlled device or the drive circuit.

Solution to Problem

According to one aspect of the present invention, there is provided a drive circuit of a voltage-controlled device, the drive circuit including: a constant current circuit configured to supply a constant current to a gate of the voltage-controlled device to turn on the voltage-controlled device; a discharge circuit configured to supply a discharge current from the gate of the voltage-controlled device to turn off the voltage-controlled device; a switch circuit configured to operate one of the constant current circuit or the discharge circuit depending on a drive signal to turn on or turn off the voltage-controlled device; a current instruction value generation circuit including a constant current source arranged separately from the constant current circuit and a resistance selection unit configured to select at least one of a plurality of resistances connected in parallel with each other between the constant current source and the ground, and configured to generate a voltage between the constant current source and the resistance selection unit, as a current instruction voltage; and a current control circuit configured to control the output current from the constant current circuit based on the current instruction value generated by the current instruction value generation circuit.

Advantageous Effects of Invention

According to one aspect of the present invention, a current instruction voltage to be output from a current instruction value generation circuit is supplied to a current control circuit configured to control an output current of a constant current circuit, so that the output current from the constant current circuit configured to charge the gate of a voltage-controlled device is controlled. Hence, the generation of the current instruction value of the current instruction value generation circuit changes turn-on capabilities corresponding to the specifications of at least one of the voltage-controlled device or the drive circuit.

Thus, an increased number of similar types of the drive circuits in the voltage-controlled device can be reduced.

DESCRIPTION OF EMBODIMENTS

Embodiments of the present invention will now be described with reference to the drawings. In illustration of the following drawings, identical or similar parts are applied with identical or similar numerals.

Also, the embodiments to be described in the following illustrates devices or components to embody the technical concept of the present invention, and the technical concept of the present invention is not particularly limited to the following descriptions in material, shape, structure, disposition, and the like of the components. In the technical scope defined by claims attached herewith, various kinds of changes or modifications are applicable to the technical concept of the present invention.

Hereinafter, embodiments of the present invention will be described with reference to the drawings.

First Embodiment

Figure 1:
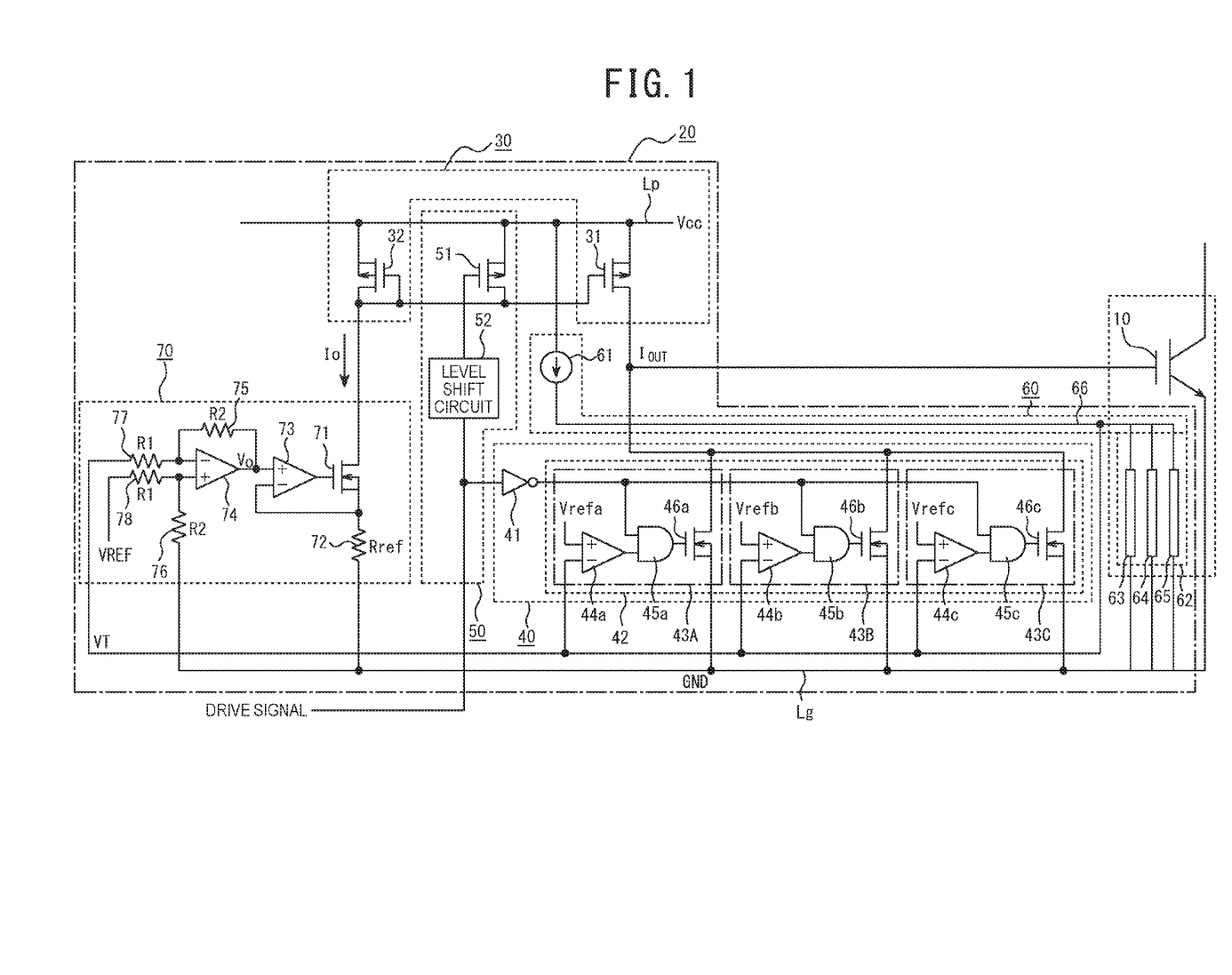
FIG. 1 is a circuit diagram illustrating a drive circuit of a voltage-controlled device in a first embodiment of the present invention.

As illustrated in FIG. 1, a voltage-controlled device 10 made of an IGBT or a power MOSFET has the collector connected in series with the emitter of, for example, another voltage-controlled device, not illustrated. The emitter is connected with the ground, and the gate connected with a drive circuit 20.

The drive circuit 20 includes a constant current circuit 30 configured to turn on the voltage-controlled device 10, a discharge circuit 40 configured to turn off the voltage-controlled device 10, a switch circuit 50 configured to switch between turning on and turning off, a current instruction value generation circuit 60, and a current control circuit 70 configured to control an output current from the constant current circuit 30.

The constant current circuit 30 includes a current mirror circuit connected between a power line Lp, to which the power supply voltage Vcc is supplied, and the gate of the voltage-controlled device 10. The constant current circuit 30 includes a first transistor 31 and a second transistor 32, each of which is made of a p-channel field effect transistor having the source connected with the power line Lp.

The first transistor 31 has the drain connected with the gate of the voltage-controlled device 10 and the gate connected with the gate and the drain of the second transistor 32.

The second transistor 32 has the drain and the gate connected with the current control circuit 70.

The discharge circuit 40 includes a logical inversion circuit (inverter) 41 configured to receive a drive signal supplied from a control circuit in the exterior, and a discharge current adjustment circuit 42 configured to receive outputs from the logical inversion circuit 41. Here, the second transistor 32 operates as an input part of the current mirror circuit and the first transistor 31 operates as an output part of the current mirror circuit, so that a current $I_{OUT}$, which is proportional to a current $I_0$ flown from the second transistor 32, is supplied from the first transistor 31.

The discharge current adjustment circuit 42 includes plural, for example, three sets of current adjustment units 43A, 43B, and 43C. The current adjustment unit 43A includes an AND gate 45a having a first input terminal into which output signals from the sign inverting circuit 41 are input, a comparator 44a connected with a second input terminal of the AND gate 45a, and an n-channel field effect transistor 46a connected with an output terminal of the AND gate 45a.

Each of the current adjustment units 43B and 43C has a similar configuration to the configuration of the current adjustment unit 43A, and includes AND gates 45b and 45c, comparators 44b and 44c, and n-channel field effect transistors 46b and 46c.

Reference voltages Vrefa to Vrefc are respectively input into a non-inverting input terminals of the comparators 44a to 44c of the current adjustment units 43A to 43C, and a current instruction voltage VT, which has been output from the current instruction value generation circuit 60 to be described later, is input into inverting input terminals of the comparators 44a to 44c. Then, the comparators 44a to 44c each output a comparison signal of high level, when the current instruction voltage VT is equal to or lower than the reference voltages Vrefa to Vrefc.

The magnitude relationship of the reference voltages Vrefa, Vrefb, and Vrefc are set to satisfy Vrefa>Vrefb>Vrefc.

For this reason, in the current adjustment units 43A to 43C, when the current instruction voltage VT is equal to or lower than the reference voltage Vrefa, an n-channel field effect transistor 46a of the current adjustment unit 43A becomes on state. When the current instruction voltage VT is equal to or lower than the reference voltage Vrefb, an n-channel field effect transistor 46b of the current adjustment unit 43B becomes on state, in addition to the current adjustment unit 43A. Further, when the current instruction voltage VT is equal to or lower than the reference voltage Vrefc, an n-channel field effect transistor 46c of the current adjustment unit 43C becomes on state, in addition to the current adjustment units 43A and 43B. Hence, as the value of the current instruction voltage VT is smaller, the discharge current amount can be increased gradually.

The switch circuit 50 includes a p-channel field effect transistor 51 and a level shift circuit 52. The p-channel field effect transistor 51 has the source connected with the power line Lp, and the drain connected with the gate of the first transistor 31 and the drain of the second transistor 32 of the current mirror circuit of the constant current circuit 30. The level shift circuit 52 is connected with the gate of the p-channel field effect transistor 51. Drive signals from the control device in the exterior are input into the level shift circuit 52. When the drive signal is high level, the level shift circuit 52 inputs the signal of high level into the gate of the p-channel field effect transistor 51 to control the p-channel field effect transistor 51 to off state, and separates the gates and the sources of the first transistor 31 and the second transistor 32 of the current mirror circuit to turn on the constant current circuit 30. When the drive signal is low level, the level shift circuit 52 inputs the signal of low level into the gate of the p-channel field effect transistor 51 to control the p-channel field effect transistor 51 to on state, and short-circuiting the gates and the sources of the first transistor 31 and the second transistor 32 of the current mirror circuit to stop the operation of the constant current circuit 30.

The current instruction value generation circuit 60 includes another constant current source 61, which is different from the constant current circuit 30 connected with the power line Lp, plural, for example, three resistance elements 63 to 65, to which the constant current from the aforementioned constant current source 61 is selectively supplied, and a resistance selection unit 62 configured to form a current instruction voltage as a current instruction value by a voltage drop of the resistance to which the constant current is selectively supplied. It is to be noted that instead of the resistance selection unit 62 including the plural resistance elements, a single resistance element may be used (hereinafter, the same configuration will be applicable). In this case, the resistance value of the single resistance element is determined depending on the characteristic of the voltage-controlled device 10.

The resistance selection unit 62 is formed in a chip configuring the voltage-controlled device 10, and the plural resistance elements 63, 64, and 65 have different resistance values. One ends of these resistance elements 63 to 65 are connected in parallel with a current supply line 66 connected with the constant current source 61, and the other ends thereof are connected with the grand line Lg. Here, resistance values R11, R12, and R13 of the resistance elements 63, 64, and 65 are set to satisfy R11<R12<R13, for example.

Depending on the current characteristic of the voltage-controlled device 10, the characteristic of the drive circuit 20 except for the resistance selection unit 62, and requests from a device to which the voltage-controlled device 10 is applied, the remaining resistance elements except for the resistance element to be selected from the plural resistance elements 63 to 65 are disconnected from the current supply line 66. The current instruction voltage VT is output from a connection point of the remaining resistance elements and the constant current source 61.

The current instruction voltage VT when only the resistance element 63 is selected is set to be equal to or higher than the reference voltage Vrefc and lower than the reference voltage Vrefb of the discharge circuit 40. The current instruction voltage VT when only the resistance element 64 is selected is set to be equal to or higher than the reference voltage Vrefb and lower than the reference voltage Vrefc of the discharge circuit 40. The current instruction voltage VT when only the resistance element 65 is selected is set to be equal to or higher than the reference voltage Vrefa of the discharge circuit 40. When plural resistance elements are made to remain from the resistance elements 63 to 65, another different current instruction voltage VT can be generated, and can be combined with another drive circuit having a different characteristic, for example. It is to be noted that in the following description, a case where only one of the resistance elements 63 to 65 is selected will be given.

The current control circuit 70 includes a current controlling transistor 71 and a resistance 72, which are connected in series with each other between the drain of the second transistor 32 of the constant current circuit 30 and the grand line Lg. The current controlling transistor 71 is made of an n-channel field effect transistor. A first operational amplifier 73 is connected to the gate of the current controlling transistor 71. The first operational amplifier 73 has the inverting input terminal connected between the source of the current controlling transistor 71 and the resistance 72, and the non-inverting input terminal into which the reference voltage $V_0$ is input.

The current control circuit 70 further includes a second operational amplifier 74 configured to supply the reference voltage $V_0$ to the first operational amplifier 73. The second operational amplifier 74 has the inverting input terminal connected with an output terminal through a resistance 75, and the non-inverting input terminal connected with the grand line Lg through a resistance 76. Here, the resistances 75 and 76 are set to have a resistance value R2 equally with each other.

The non-inverting input terminal of the second operational amplifier 74 is supplied with the current instruction voltage VT, which is output through the resistance 77 from a connecting point of the constant current source 61 of the current instruction value generation circuit 60 and the resistance selection unit 62. The reference voltage VREF is supplied through the resistance 78 to the inverting input terminal of the second operational amplifier 74. Here, the resistances 77 and 78 are set to have a resistance value R1 equally with each other.

The output voltage $V_0$ of the second operational amplifier 74 can be represented as $$V_0 = (R2/R1)(VREF - VT) \quad (1),$$

where R10 is a resistance value of the resistance element selected from the resistance selection unit 62, and the resistance value R10 is negligibly smaller than the resistance value R1 of the resistances 77 and 78.

Further, as the output voltage $V_0$ of the second operational amplifier 74 is supplied to the non-inverting input terminal of the operational amplifier 73, a reference current $I_0$ of the constant current circuit 30 controlled by the first operational amplifier 73, that is, the current flowing across the resistance 72 can be represented by the following expression (2) by referring to the above expression (1), $$I_0 = V_0/Rref = \{R2/(R1 \times Rref)\}(VREF - VT) \quad (2),$$

since the two input terminals of the first operational amplifier 73 are virtually short-circuited.

Here, Rref is a resistance value of the resistance 72, and the resistance values R1, R2, and Rref and the reference voltage VREF are constant numbers. Hence, only the current instruction voltage VT is considered to be a variable in the above expression (2). In other words, the constant current capability of driving the voltage-controlled device 10 can be controlled with accuracy, when the accuracies of elements in the expression (2) are adjusted, except for the current instruction voltage VT. It is to be noted that as understood by the expression (2), the reference current $I_0$ is larger, as the current instruction voltage VT is smaller.

According to the first embodiment, the drive circuit 20 is configured to control turning on and turning off of the voltage-controlled device 10 configured to control the gate. From the resistance elements 63 to 65 of the resistance selection unit 62 in the current instruction value generation circuit 60, the optimum resistance element that should turn on and turn off is selected depending on the specifications of the voltage-controlled device 10, which is a control target. The remaining resistance elements except for the selected resistance element are disconnected from connection points with the current supply line 66, and are separated from the current supply line 66.

Therefore, the current instruction voltage VT is output from the current instruction value generation circuit 60, depending on the specifications of the voltage-controlled device 10. The current instruction voltage VT is supplied to the discharge circuit 40 and the current control circuit 70.

In the discharge circuit 40, the number of the current adjustment units 43A to 43C, which becomes on state depending on the current instruction voltage VT, is changed and adjusted to a discharge current in accordance with the specifications of the voltage-controlled device 10. In other words, when the resistance element 65 is selected, only the n-channel field effect transistor 46a of the current adjustment unit 43A turns on, and the discharge current of the voltage-controlled device 10 is the smallest. When the resistance element 64 is selected the n-channel field effect transistor 46a of the current adjustment unit 43A and the n-channel field effect transistor 46b of the current adjustment unit 43B turn on, and the discharge current of the voltage-controlled device 10 is a medium degree. When the resistance element 63 is selected, the n-channel field effect transistors 46a to 46c of all of the current adjustment units 43A to 43C turn on, and the discharge current of the voltage-controlled device 10 is the largest.

The current instruction voltage VT is supplied to the current control circuit 70, and in the current control circuit 70, the reference current $I_0$ of the constant current circuit 30 is controlled in accordance with the above-described expression (2), based on the current instruction voltage VT. For this reason, the output current $I_{OUT}$, which is output from the constant current circuit 30, is controlled in accordance with the specifications of the voltage-controlled device 10.

In other words, when the resistance element 63 is selected, the current instruction voltage VT is the smallest and the reference current $I_0$ has the largest value. When the resistance element 64 is selected, the current instruction voltage VT is a medium degree, and the reference current $I_0$ also has a medium value. Further, when the resistance element 65 is selected, the current instruction voltage VT has the largest value, and the reference current $I_0$ has the smallest value.

In this state, when the drive signal of high level is supplied to the drive circuit 20, the gate voltage of high level from the level shift circuit 52 of the switch circuit 50 is supplied to the gate of the p-channel field effect transistor 51, and the p-channel field effect transistor 51 is controlled to off state. Therefore, the first transistor 31 included in the output part of the current mirror circuit becomes on state, and the output current $I_{OUT}$ depending on the reference current $I_0$ is supplied from the constant current circuit 30 to the gate of the voltage-controlled device 10. Then, the voltage-controlled device 10 turns on and is in on state. In this situation, in the discharge circuit 40, the output from the sign inverting circuit 41 becomes low level, and outputs from the AND gates 45a to 45c of the current adjustment unit 43A to 43C become low level, and the n-channel field effect transistors 46a to 46c becomes off state. Thus, the turn-off operation by the discharge circuit 40 is stopped.

In contrast, when the drive signal of low level is input into the drive circuit 20, the gate signal of low level from the level shift circuit 52 in the switch circuit 50 is supplied to the p-channel field effect transistor 51. For this reason, the p-channel field effect transistor 51 is controlled to on state, and the gate and the source of the p-channel field effect transistor 31 are short-circuited. Then, the p-channel field effect transistor 31 becomes off state, accordingly, and the operation of the constant current circuit 30 is stopped.

On the other hand, in the discharge circuit 40, the output from the sign inverting circuit 41 becomes high level, and the AND gates 45a to 45c of the current adjustment units 43A to 43C are capable of outputting. Then, the current instruction voltage VT depending on the resistance element that has been selected by the current instruction value generation circuit 60 makes any one of the AND gate 45a, the AND gates 45a and 45b, or the AND gates 45a to 45c become high level. Thus, the n-channel field effect transistor 46a, the n-channel field effect transistors 46a and 46b, and the n-channel field effect transistors 46a to 46c are on state, the discharge current is controlled to any one of the smallest, medium, or largest value, so that the discharge current can be adjusted in accordance with the specifications of voltage-controlled device 10.

It is to be noted that the charging and discharging current of the gate of voltage-controlled device 10 may be a problem, if it is too large or too small. When the charging and discharging current is too large, the switching speed of the voltage-controlled device is too fast and a switching noise will be a problem. When the charging and discharging current is too small, the switching speed of the voltage-controlled device 10 is too slow and the operation of the product will be hindered.

Thus, there is a need of optimally adjusting the charging and discharging current of the voltage-controlled device in accordance with the specifications of the drive circuit except for at least one of the voltage-controlled device 10 or the resistance selection unit 62. In one embodiment of the present invention, the resistance selection unit 62 is configured to select any one of the resistance elements 63 to 65 in accordance with the specifications of the drive circuit except for at least one of the voltage-controlled device 10 or the resistance selection unit 62. This configuration allows a single drive circuit 20 to drive the voltage-controlled device 10 having three specifications in an optimal charging and discharging current.

Figure 2:
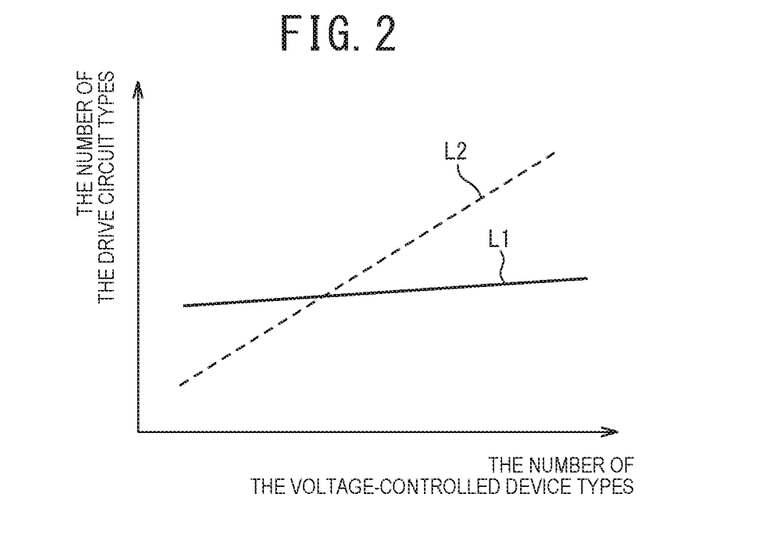
FIG. 2 is a graph illustrating a relationship between the number of the voltage-controlled device types and the number of the drive circuit types in the present invention and a conventional example.

Therefore, the number of the drive circuit types with respect to the number of the voltage-controlled device types can be set such that the number of the drive circuit types can be increase moderately, as the number of the voltage-controlled device types increases, as illustrated in the solid characteristic line L1 of FIG. 2. This configuration suppresses an increase of photo masks, for example, to be used in the manufacturing process of the drive circuit 20, and allows easy storage or management of the mass production components such as the photo masks.

In contrast, in a conventional example where the current instruction value generation circuit 60 is not provided, the number of the drive circuit types is increased largely, as the number of the voltage-controlled device types increases, as illustrated in the dotted characteristic line L2 of FIG. 2. This configuration increases the number of the photo masks to be used in the manufacturing process, and complicates the storage or management of the mass production components.

As in the first embodiment, the resistance selection unit 62 is formed in a chip of forming the voltage-controlled device 10, so that the resistance elements can be selected in accordance with the specifications at the time of producing the voltage-controlled device 10. When a single resistance element is provided instead of the resistance selection unit 62, the drive circuit 20 no longer has to select the resistance element in accordance with the specifications of the voltage-controlled device 10. By arranging the resistance element in the chip of forming the voltage-controlled device 10, the resistance value is changed depending on the temperature dependence of the voltage-controlled device, so that the temperature dependence of the voltage-controlled device can be compensated.

It is to be noted that in the first embodiment, the description has been given of the case where the resistance value R10 of the resistance selection unit 62 in the current instruction value generation circuit 60 is set to be a negligible smaller value than the resistance value R1 of the input side resistances 77 and 78 of the second operational amplifier 74 of the current control circuit 70. However, the present invention is not limited to the above-described configuration. Even if the resistance value of the resistance elements 63 to 65 of the resistance selection unit 62 is set to have a large value to some extent, the output voltage $V_O$ of the second operational amplifier 74 can be controlled.

Figure 3:
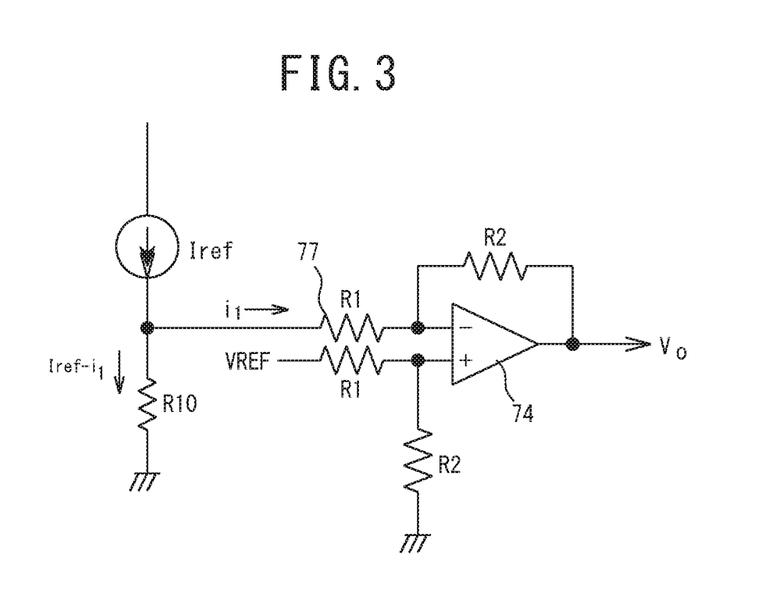
FIG. 3 is a circuit diagram illustrating a part of a current instruction value generation circuit and a current control circuit.

In other words, the relationship between the current instruction value generation circuit 60 and the second operational amplifier 74 of the current control circuit 70 can be represented in FIG. 3.

In FIG. 3, the voltage of the non-inverting input terminal of the second operational amplifier 74 can be represented by $$\{R2/(R1+R2)\}VREF \quad (3),$$

where Iref is a constant current value output from the constant current source 61.

Then, when R10 is the resistance value selected by the resistance selection unit 62 and $i_1$ is a current flowing from the constant current source 61 across the resistance 77 of the current control circuit 70, Iref-$i_1$ is the current flowing across the selected resistance element.

Then, as to the input side voltage of the second operational amplifier 74, the voltage of the inverting input terminal and the voltage of the non-inverting input terminal is equal by the virtual short-circuiting operation of the second operational amplifier 74, and the following expression is satisfied.

$$R10(Iref-i_1)-R1 \cdot i_1 = \{R2/(R1+R2)\}VREF \quad (4).$$

When the expression (4) is modified, $$R10 \cdot Iref - (R10+R1)i_1 = \{R2/(R1+R2)\}VREF \quad (5).$$

When the expression (5) is further modified, $$(R1+R10)i_1 = R10 \cdot Iref - \{R2/(R1+R2)\}VREF \quad (6).$$

Thus, the current flowing across the resistance 77 on the input side of the second operational amplifier 74 is as follows.

Expression 1

$$i_1 = \frac{R10 \cdot Iref}{R1+R10} - \frac{R2 \cdot VREF}{(R1+R10)(R1+R2)} \quad (7)$$

Then, the output voltage $V_O$ of the second operational amplifier 74 is as follows.

Expression 2

$$V_o = \frac{R2}{R1+R2}VREF - R2 \cdot i_1 \quad (8)$$

$$= \frac{R2}{R1+R2}VREF - \frac{R2 \cdot R10 \cdot Iref}{R1+R10} + \frac{R2^2 \cdot VREF}{(R1+R10)(R1+R2)}$$

Coefficient parts in the first and third terms in relation to VREF in expression (8) are combined as follows.

Expression 3

$$\frac{1}{(R1+R10)(R1+R2)}\{R2(R1+R10)+R2^2\} = \quad (9)$$

$$\frac{R2}{(R1+R10)(R1+R2)}\{R2(R1+R2)+R2 \cdot R10\} =$$

$$\frac{R2}{R1+R10} + \frac{R2 \cdot R10}{(R1+R10)(R1+R2)}$$

Thus, the above expression (8) is as follows.

Expression 4

$$V_o = \frac{R2}{R1+R10}(VREF - R10 \cdot Iref) + \frac{R2 \cdot R10}{(R1+R10)(R1+R2)}VREF \quad (10)$$

In the expression (10), the output voltage $V_O$ of the second operational amplifier 74 can be calculated.

The coefficient part of VREF in the second term on the right side of the expression (10) can be represented by expression 5.

Expression 5

$$\frac{R2\left(\frac{R10}{R1}\right)}{\left(1+\frac{R10}{R1}\right)(R1+R2)} \quad (11)$$

Hence, by setting R1>>R10 as in the above-described first embodiment, the second term on the right side becomes zero and the above-described expression (1) is obtainable.

Second Embodiment

Figure 4:
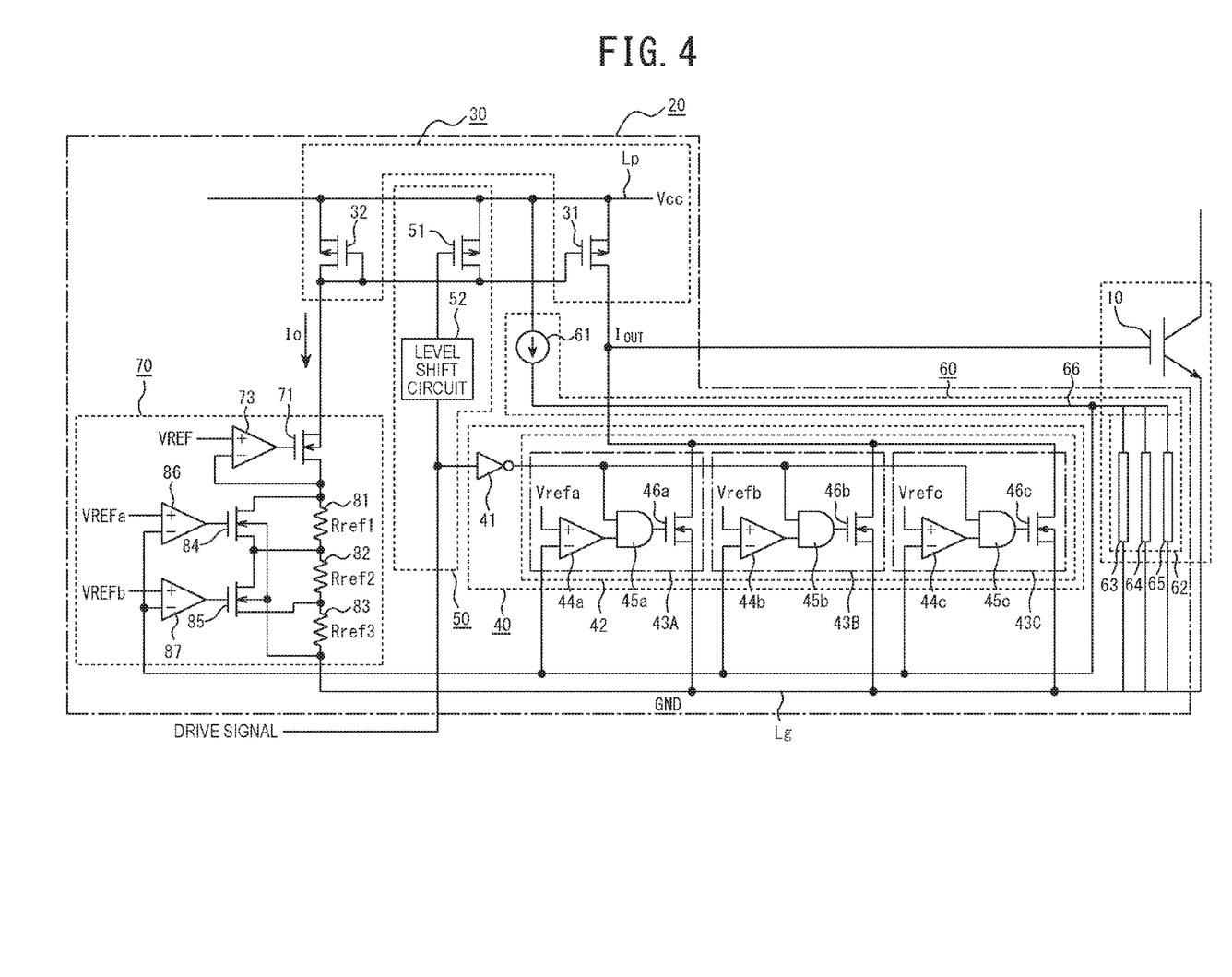
FIG. 4 is a circuit diagram illustrating the drive circuit of the voltage-controlled device in a second embodiment of the present invention.

Next, a second embodiment of the present invention will be described in accordance with FIG. 4.

In the second embodiment, the configuration of the current control circuit 70 in the first embodiment is changed.

In other words, in the second embodiment, the configurations of FIG. 1 in the first embodiment other than the changed configuration of the current control circuit 70 are same with the configurations of FIG. 1. The same reference numerals are applied to the corresponding parts of FIG. 1, and the detailed descriptions will be omitted.

In the above-described configuration in the first embodiment, in the current control circuit 70, the second operational amplifier 74 and the resistances 75, 76, 77, and 78 are omitted, and the resistance 72 is split into three resistances 81 to 83.

An n-channel field effect transistor 84 for bypassing is connected in parallel with the resistance 81, and an n-channel field effect transistor 85 for bypassing is connected in parallel with the resistance 82.

The output terminals of the first comparator 86 and the second comparator are connected respectively to the gates of the n-channel field effect transistors 84 and 85.

A reference voltage VREFa is input into a non-inverting input terminal on the input side of the first comparator 86, and the current instruction voltage VT, which is output from current instruction value generation circuit 60, is input into an inverting input terminal of the first comparator 86.

A reference voltage VREFb is input into a non-inverting input terminal, on the input side of the second comparator 87, and the current instruction voltage VT, which is output from the current instruction value generation circuit 60, is input into an inverting input terminal of the first comparator 86. Here, the relationship between the reference voltages VREFa and VREFb is set to satisfy VREFa<VREFb. In addition, the reference voltage VREFa is set to be higher than the current instruction voltage VT1 when the resistance selection unit 62 of the current instruction value generation circuit 60 selects the resistance element 63, and is set to be lower than the current instruction voltage VT2 when the resistance selection unit 62 of the current instruction value generation circuit 60 selects the resistance element 64. Further, the reference voltage VREFb is set to be higher than the current instruction voltage VT2 when the resistance selection unit 62 of the current instruction value generation circuit 60 selects the resistance element 64, and is set to be lower than the current instruction voltage VT3 when the resistance selection unit 62 of the current instruction value generation circuit 60 selects the resistance element 65.

According to the second embodiment, the discharge circuit 40 performs the turn-off operation similar to the operation in the above-described first embodiment. However, when the resistance selection unit 62 of the current instruction value generation circuit 60 selects the resistance element 65, in the current control circuit 70, the current instruction voltage VT3 to be output at this timing is a value higher than the reference voltage VREFa of the first comparator 86 and the reference voltage VREFb of the second comparator 87. Thus, The outputs from the first comparator 86 and the second comparator 87 are low level, and the n-channel field effect transistors 84 and 85 keep off state. Therefore, the drain of the second transistor 32 in the constant current circuit 30 is connected through the three resistances 81 to 83 of the current controlling transistor 71 to the grand line Lg.

In this situation, the reference current $I_0$ is represented in the following expression (6), where Rref1 is a resistance value of the resistance 81, Rref2 is a resistance value of the resistance 82, and Rref3 is a resistance value of the resistance 83.

Expression 6

$$I_o = \frac{VREF}{Rref1 + Rref2 + Rref3} \quad (12)$$

The reference current $I_0$ is set to the smallest current value.

When the resistance selection unit 62 selects the resistance element 64, the current instruction voltage VT2, which is output at this timing, is lower than the reference voltage VREFb of the second comparator 87. Therefore, the output from the second comparator 87 becomes high level. This configuration turns the n-channel field effect transistor 85 to on state to bypass the resistance 82.

Hence, the reference current $I_0$ satisfies the expression (7), and is set to have a current value of a medium level.

Expression 7

$$I_o = \frac{VREF}{Rref1 + Rref3} \quad (13)$$

Further, when the resistance selection unit 62 selects the resistance element 63, the current instruction voltage VT1, which is output at this timing, is lower than the reference voltage VREFa of the first comparator 86, which is lower than the reference voltage VREFb of the second comparator 87. In addition to the second comparator 87, the output from the first comparator 86 becomes high level, too.

The n-channel field effect transistors 84 and 85 are both in on state and the resistances 81 and 82 are bypassed. Thus, the reference current $I_0$ is represented as the following expression (8).

Expression 8

$$I_o = \frac{VREF}{Rref3} \quad (14)$$

The reference current $I_0$ is set to the maximum current value.

Thus, in a similar manner as described in the first embodiment, the output current $I_{OUT}$ of the constant current circuit 30 can be controlled depending on the resistance value of the selected one of the resistance elements 63 to 65, which is selected by the resistance selection unit 62 of the current instruction value generation circuit 60, so that the turn-off operation can be performed appropriately in accordance with the specifications of the voltage-controlled device 10.

Third Embodiment

A third embodiment of the present invention will be described with reference to FIG. 5, next.

In the third embodiment, the constant current source 61 and the resistance selection unit 62 are omitted, but a current instruction value selection circuit is separately provided.

Figure 5:
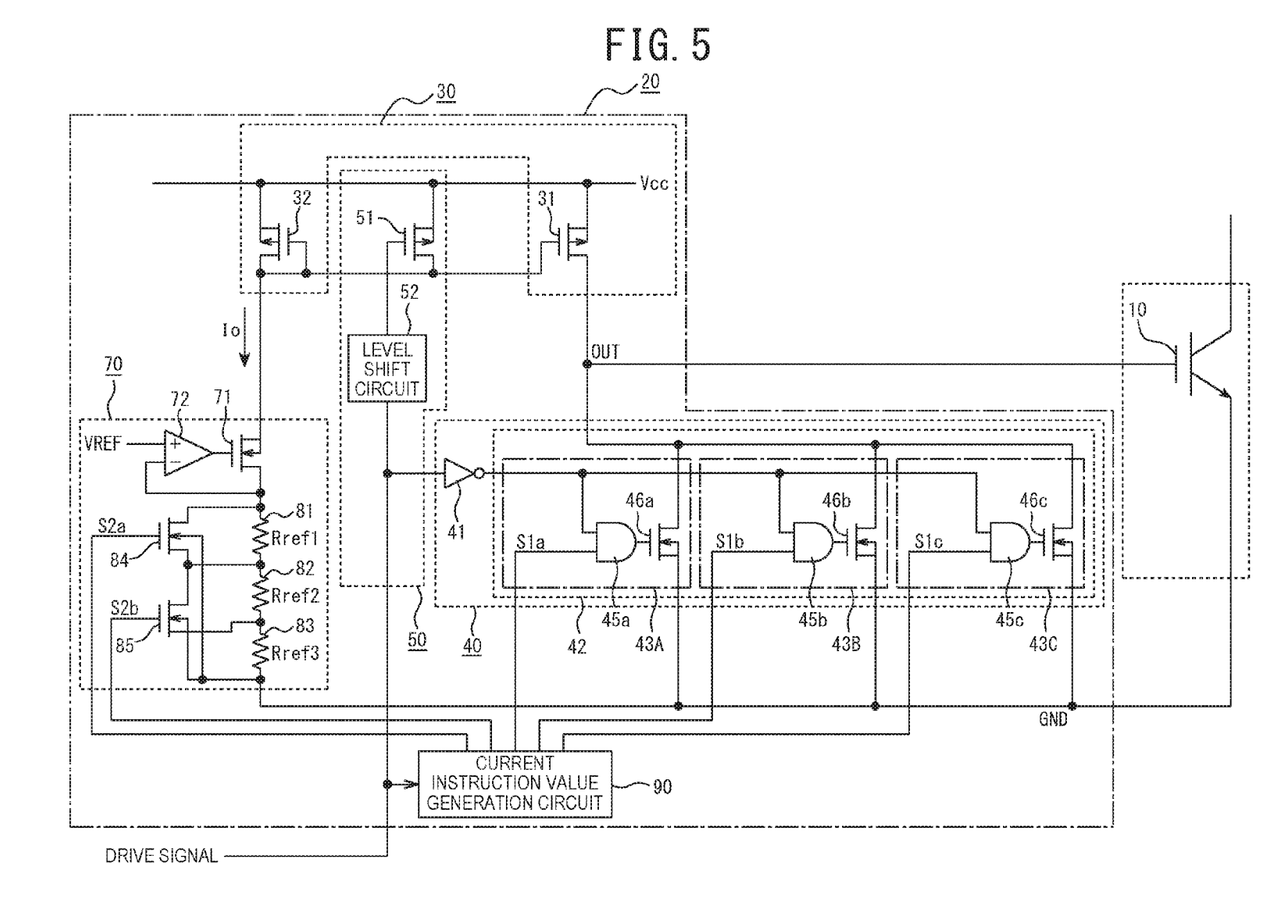
FIG. 5 is a circuit diagram illustrating the drive circuit of the voltage-controlled device in a third embodiment of the present invention.

In the third embodiment, as illustrated in FIG. 5, the configurations of the current adjustment units 43A to 43C of the discharge circuit 40 and the configuration of the current control circuit 70 in the first and the second embodiments are changed, and the current instruction value generation circuit 60 are omitted, but instead, a current instruction value generation circuit 90 is provided.

In the current adjustment units 43A to 43C of the discharge circuit 40, as illustrated in FIG. 5 the comparators 44a to 44c are omitted, but instead, the current instruction signal output from the current instruction value generation circuit 90 is supplied to the AND gates 45a to 45c.

On the other hand, in the current control circuit 70, as compared to the configuration in the second embodiment, the first comparator 86 and the second comparator 87 are omitted. Instead, the current instruction signals output from the current instruction value generation circuit 90 are supplied to the gates of the n-channel field effect transistors 84 and 85.

The current instruction value generation circuit 90 is made of a data selection circuit of EPROM, fuse ROM, ZAP, or the like, so that the current instruction value signal to be output is written in accordance with the specifications of the voltage-controlled device that should be driven.

That is, the current instruction value generation circuit 90 is configured to output the current value generation signals so that depending on the drive signal, the discharge circuit 40 and the current control circuit 70 operate in a similar manner to the case where the resistance selection unit of the current instruction value generation circuit 60 in the second embodiment selects any one of the resistance elements 63 to 65. In other words, in order to correspond to the case where the resistance element 65 is selected and the current instruction voltage VT is set to the maximum value VT3, data instructing a smallest current value mode is written in the current instruction value generation circuit 90. In the smallest current value mode, the current instruction value selection signal S1a is set to high level, and the current instruction value selection signals Sib and S1c and the current instruction value selection signals S2a and S2b are controlled to low level.

Also, in order to correspond to the case where the resistance element 64 is selected and the current instruction voltage VT is set to a medium value VT2, data instructing a medium current value mode is written in the current instruction value generation circuit 90. In the medium current value mode, the current instruction value selection signal S1a, the current instruction value selection signal S1b, and the current instruction value selection signal S2b are controlled to high level, and the current instruction value selection signal Sic and the current instruction value selection signal S2a are controlled to low level.

Further, in order to correspond to the case where the resistance element 65 is selected and the current instruction voltage VT is set to the minimum value VT1, data instructing the maximum current value mode is written in the current instruction value generation circuit 90. In the maximum current value mode, the current instruction value selection signals S1a to S1c and the current instruction value selection signals S2a and S2b are controlled to high level.

According to the third embodiment, in the case where the reference current $I_0$ of the constant current circuit 30 is set to the minimum value in accordance with the specifications of the drive circuit excluding at least one of the voltage-controlled device 10, which should be driven, or the current instruction value generation circuit 90, the current instruction value generation circuit 90 is set to be in a minimum value mode. In the minimum value mode, only the n-channel field effect transistor 46a of the current adjustment unit 43A in the discharge circuit 40 is set to on state, the discharge current is set to be a minimum value, and the n-channel field effect transistors 84 and 85 of the current control circuit 70 are both set to off state, so that the reference current $I_0$ of the constant current circuit 30 is controlled to have the minimum current value.

In the case where the reference current $I_0$ of the constant current circuit 30 is set to the medium value in accordance with the specifications of the drive circuit excluding at least one of voltage-controlled device 10, which should be driven, or the current instruction value generation circuit 90, the current instruction value generation circuit 90 is set to be in a medium value mode. In the medium value mode, the n-channel field effect transistors 46a and 46b of the current adjustment units 43A and 43B of the discharge circuit 40 are set to on state, the discharge current is set to a median value, and only the n-channel field effect transistor 85 of the current control circuit 70 is set to on state, so that the resistance 83 is bypassed and the reference current I° of the constant current circuit 30 is controlled to have a medium current value.

In the case where the reference current $I_0$ of the constant current circuit 30 is set to the maximum value in accordance with the specifications of the drive circuit excluding at least one of voltage-controlled device 10, which should be driven, the current instruction value generation circuit 90 is set to be in a maximum value mode. In the maximum value mode, the n-channel field effect transistors 46a to 46c of the current adjustment units 43A to 43C of the discharge circuit 40 are set to on state, the discharge current is set to have the maximum value, and the n-channel field effect transistors 85 and 86 of the current control circuit 70 are set to on state, so that the resistance 83 is bypassed and the reference current $I_0$ of the constant current circuit 30 is controlled to have a maximum current value.

In the third embodiment, the written data of the current instruction value generation circuit 90 can be changed depending on the specifications of the drive circuit excluding at least one of the voltage-controlled device 10, which should be driven by the drive circuit 20, or the current instruction value generation circuit 90. The resistance selection unit 62 can be omitted. This configuration eliminates the process of selecting a resistance element, and the mode change can be performed easily.

It is to be noted that in the first and second embodiments, the descriptions have been given of the case where the resistance elements 63 to 65 of the resistance selection unit 62 are connected in parallel. However, the present invention is not limited to this. The resistance elements may be connected in series, and an interconnection part configured to bypass the demanded number of the resistance elements depending on the demanded resistance value.

In the first and second embodiments, the descriptions have been given of the case where the resistance elements other than the needed resistance elements of the resistance elements 63 to 65 of resistance selection unit 62 are disconnected. However, the present invention is not limited to this. A selective switch configured to select a resistance element may be arranged.

In the first and second embodiments, the descriptions have been given of the case where three resistance elements of the resistance selection unit 62 are provided. However, the present invention is not limited to this. Four or more resistance elements may be provided. The number of the current adjustment units of the discharge circuit 40 may be changed accordingly, and in the second embodiment, the resistance of the current control circuit 70, the number of the n-channel field effect transistors, and the number of the comparators can be changed. In addition, in the third embodiment, the number of the current instruction value selection signals of the current instruction value generation circuit 90 can be changed.

In the first to third embodiments, the descriptions have been given of the case where both of the current values of the discharge circuit 40 and the current control circuit 70 are adjusted. However, the current adjustment of the discharge circuit 40 may be omitted.

The current control circuit 70 of FIG. 5 may be changed to the circuit to which the operational amplifiers 73 and 74 and the resistances 75 to 78 of FIG. 1 are applied, and a D/A converter may be added to the configuration of the current instruction value generation circuit 90. Outputs from the D/A converter may be input into a terminal of the resistance 77 instead of the signal VT. In this case, the digital data that are input into the D/A converter may be written in the current instruction value generation circuit 90, together with the data instructing the mode.

REFERENCE SIGNS LIST

10 . . . voltage-controlled device
20 . . . drive circuit
30 . . . constant current circuit
31 . . . first transistor
32 . . . second transistor
40 . . . discharge circuit
41 . . . sign inversion circuit
42 . . . discharge current adjustment circuit
43A to 43C . . . current adjustment units
50 . . . switch circuit
51 . . . p-channel field effect transistor
52 . . . level shift circuit
60 . . . current instruction value generation circuit
61 . . . constant current source
62 . . . resistance selection unit
63 to 65 . . . resistance element 70 . . . current control circuit
71 . . . current controlling transistor
72 . . . resistance
73 . . . first operational amplifier
74 . . . second operational amplifier
81 to 83 . . . resistances
84, 85 . . . n-channel field effect transistors
86 . . . first comparator
87 . . . second comparator
90 . . . current instruction value generation circuit

The invention claimed is:

1. A drive circuit of a voltage-controlled device, the drive circuit comprising:
   a constant current circuit configured to supply a constant current to a gate of the voltage-controlled device to turn on the voltage-controlled device;
   a discharge circuit configured to supply a discharge current from the gate of the voltage-controlled device to turn off the voltage-controlled device;
   a switch circuit configured to operate either one of the constant current circuit or the discharge circuit depending on a drive signal to turn on or turn off the voltage-controlled device;
   a current instruction value generation circuit comprising a constant current source arranged separately from the constant current circuit and a resistance selection unit configured to select at least one of a plurality of resistances connected in parallel with each other between the constant current source and the ground, and configured to generate a voltage between the constant current source and the resistance selection unit, as a current instruction voltage; and
   a current control circuit configured to control an output current from the constant current circuit based on the current instruction voltage generated by the current instruction value generation circuit.

2. The drive circuit of the voltage-controlled device according to claim 1, wherein the plurality of resistance elements are arranged in a chip forming the voltage-controlled device.

3. The drive circuit of the voltage-controlled device according to claim 1, wherein the discharge circuit comprises a discharge current adjustment circuit configured to adjust a current value of the discharge current based on the current instruction voltage generated by the current instruction value generation circuit.

4. The drive circuit of the voltage-controlled device according to claim 3, wherein the discharge current adjustment circuit is configured such that a plurality of current adjustment units are connected in parallel with each other, the plurality of current adjustment units comprising comparators configured to compare different set voltages with the current instruction voltage.

5. The drive circuit of the voltage-controlled device according to claim 1, wherein the current control circuit comprises an operational amplifier configured to determine an output current from the constant current circuit based on a voltage difference between a reference voltage and the current instruction voltage generated by the current instruction value generation circuit.

6. The drive circuit of the voltage-controlled device according to claim 1, wherein the current control circuit comprises a comparator configured to compare a reference voltage with the current instruction voltage generated by the current instruction value generation circuit to change the output current from the constant current circuit in a plurality of steps depending on a comparison result.

7. The drive circuit of the voltage-controlled device according to claim 1,
   wherein the constant current circuit comprises a current mirror circuit connected between the gate of the voltage-controlled device and a power supply voltage, and
   wherein the current mirror circuit comprises:
   a first transistor connected between the power supply voltage and the gate of the voltage-controlled device to form an output part of the current mirror circuit; and
   a second transistor connected between the power supply voltage and the voltage-controlled device to form an input part of the current mirror circuit.

8. The drive circuit of the voltage-controlled device according to claim 1, wherein the voltage-controlled device is made of either an IGBT or a MOSFET.

* * * * *